United States Patent
Chae

(10) Patent No.: US 8,086,786 B2
(45) Date of Patent: Dec. 27, 2011

(54) NON-VOLATILE MEMORY DEVICE AND ASSOCIATED PROGRAMMING METHOD

(75) Inventor: Dong-hyuk Chae, Gwanak-gu (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 630 days.

(21) Appl. No.: 12/045,136

(22) Filed: Mar. 10, 2008

(65) Prior Publication Data
US 2008/0235451 A1    Sep. 25, 2008

(30) Foreign Application Priority Data
Mar. 19, 2007    (KR) .................. 10-2007-0026804

(51) Int. Cl.
*G06F 13/00* (2006.01)
(52) U.S. Cl. .................. 711/103; 711/118; 711/155
(58) Field of Classification Search .................. None
See application file for complete search history.

(56) References Cited

U.S. PATENT DOCUMENTS

| | | | |
|---|---|---|---|
| 2005/0226046 A1 | 10/2005 | Lee et al. | |
| 2006/0203549 A1* | 9/2006 | Lee | 365/185.12 |
| 2007/0002615 A1* | 1/2007 | Lee et al. | 365/185.03 |
| 2007/0014163 A1* | 1/2007 | Kim | 365/189.12 |
| 2007/0028155 A1* | 2/2007 | Kim et al. | 714/755 |
| 2007/0041247 A1* | 2/2007 | Kang et al. | 365/185.12 |

FOREIGN PATENT DOCUMENTS

| | | | |
|---|---|---|---|
| KR | 1020030033679 A | 5/2003 | |
| KR | 1020050096445 A | 10/2005 | |
| KR | 100590388 B1 | 6/2006 | |

* cited by examiner

*Primary Examiner* — Than Nguyen
(74) *Attorney, Agent, or Firm* — Volentine & Whitt, PLLC

(57) ABSTRACT

A non-volatile memory device having a memory array is configured to prevent power voltage noise generation during programming, thereby improving reliability. An associated programming method of the non-volatile memory device includes storing data input from an external source to a cache register. The stored data is moved to a main register. The cache register is cleared and the data stored in the main register is programmed to the memory cell array.

15 Claims, 7 Drawing Sheets

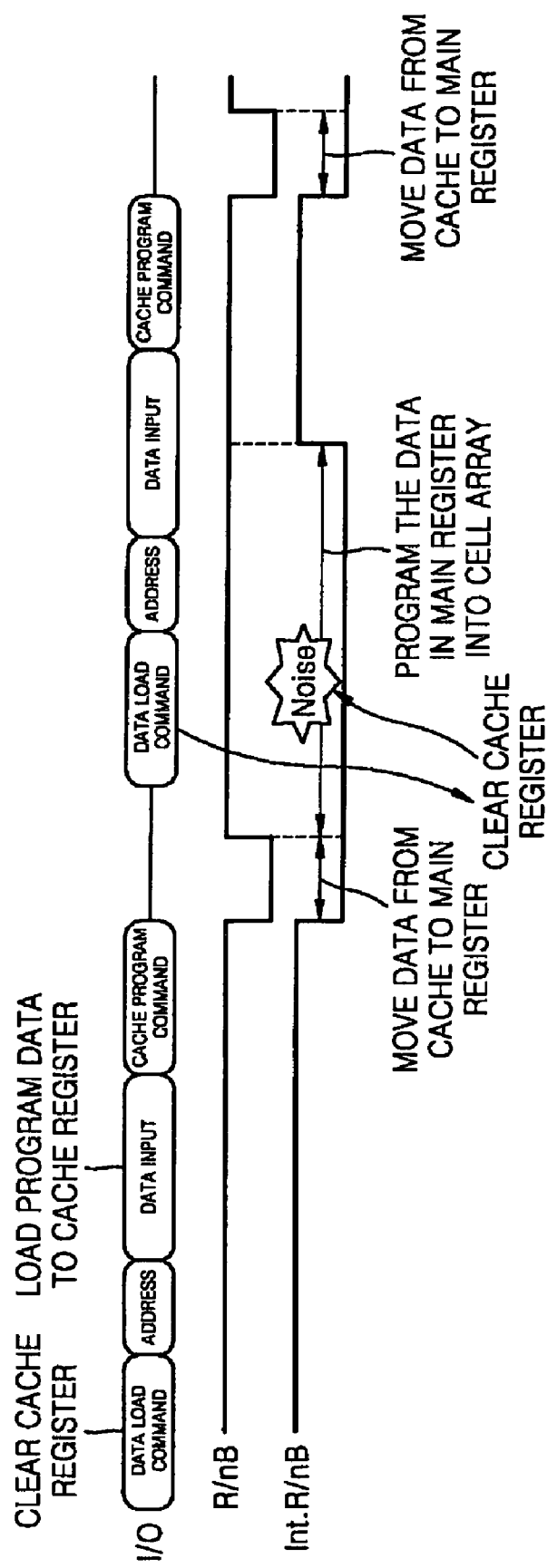

NON-VOLATILE MEMORY DEVICE AND ASSOCIATED PROGRAMMING METHOD

CROSS-REFERENCE TO RELATED PATENT APPLICATION

This application claims the benefit of Korean Patent Application No. 10-2007-0026804, filed on Mar. 19, 2007, in the Korean Intellectual Property Office, the disclosure of which is incorporated herein in its entirety by reference

BACKGROUND OF THE INVENTION

1. Field of the Invention

Embodiments of the invention relate to a non-volatile memory device and an associated programming method. More particularly, embodiments of the invention relate to a non-volatile memory device and an associated programming method to prevent noise produced by a power voltage to improve the reliability of a cache program operation.

2. Discussion of Related Art

Flash memories are non-volatile memory devices that electrically store, read and delete data. These devices combine lower power consumption and fast access times as compared to a typical hard disk drive. A flash memory may be classified as a NOR or a NAND memory depending on the connection state of a cell transistor and a bit line. In a NOR type flash memory, two or more cell transistors are connected to one bit line in parallel. Data is stored by using the channel hot electron method and data is deleted by using the Fowler-Nordheim (F-N) tunneling method. In a NAND type flash memory, two or more cell transistors are connected to one bit line in series and data is stored or deleted by using the F-N tunneling method. Conventionally, the NOR type flash memory has a high current consumption. This makes it hard to achieve high-integration, but does accommodate high speed performance. NAND type flash memory devices utilize lower cell currents as compared to NOR type flash memory devices, and thus high-integration is easier to achieve.

FIG. 1A is a circuit diagram of a memory cell included in a conventional NAND type flash memory that includes word lines WL11 through WL14 and memory cells M11 through M14. Memory cells M11 through M14 form a string structure with transistors ST1 and ST2 which are connected between bit line BL and ground voltage VSS in series. Since the conventional NAND type flash memory uses a low cell current, programming of all memory cells connected to one word line is performed in programming operation 1. FIG. 1B is a circuit diagram of a memory cell included in a conventional NOR type flash memory including memory cells M21 through M26 connected between bit lines BL1 and BL2 and source lines CSL. In conventional NOR type flash memory, current consumption is significantly increased and thus, a programming operation of a fixed number of memory cells is performed in programming operation 1.

FIG. 2 is a timing diagram illustrating a cache program operation performed in a conventional non-volatile memory device. In the cache program operation, data that is to be programmed is input through a cache register. Data in the cache register is moved to a main register and then data stored in the main register is programmed to a memory cell array. As illustrated in FIG. 2, a data load command, an address, data input, and a cache program command are input through an input/output (I/O) port from an external controller. When the data load command is input, the cache register included in the conventional non-volatile memory device is cleared. As data is input through the I/O port, the data is loaded into the cache register. Also, the cache program command is input and a ready/busy (R/nB) signal and an internal ready/busy (Int.R/nB) signal are changed to a logic low in response to the cache program command. While the ready/busy (R/nB) signal is at a logic low, the data stored in the cache register is moved to the main register. While the data stored in the main register is programmed to the memory cell array, the ready/busy (R/nB) signal returns to a logic high. The external controller provides the data load command, an address of a page that is to be programmed, and data to the conventional non-volatile memory device. As the data load command is input, the conventional non-volatile memory device clears the cache register in which previous data was stored. If the cache register is not cleared, data input for a previous programming page may remain in the cache register and thus unintended programming may occur while programming a subsequent page.

The data load command may be input anytime during programming for the previous page, and thus, a clearing operation of the cache register can be performed in the middle of the previous page programming. However, in a specific section or period during cache programming (for example, a section of sensing data for verifying a programming operation), reliability of the operation may be significantly decreased due to power voltage noise. When a clearing operation of the cache register occurs in the exemplary sensing section described above, a portion of data of the register is simultaneously changed. Consequently, noise associated with the power voltage may be generated, thereby decreasing the reliability of the programming operation. While performing a cache program operation, the effects of power voltage noise cannot be removed. This decreases the reliability of the cache program operation.

SUMMARY OF THE INVENTION

Exemplary embodiments of the present invention are directed to a non-volatile memory device which prevents reliability of the device from decreasing as a result of power voltage noise generation due to a clearing operation of a cache register. In an exemplary embodiment, programming method includes storing data input from an external source to a cache register. The stored data is moved to a main register and the cache register is cleared. The data stored in the main register is programmed to the memory cell array.

BRIEF DESCRIPTION OF THE DRAWINGS

FIG. 2 is a timing diagram illustrating a cache program operation performed in a conventional non-volatile memory device;

DESCRIPTION OF EMBODIMENTS

Figure 1A:
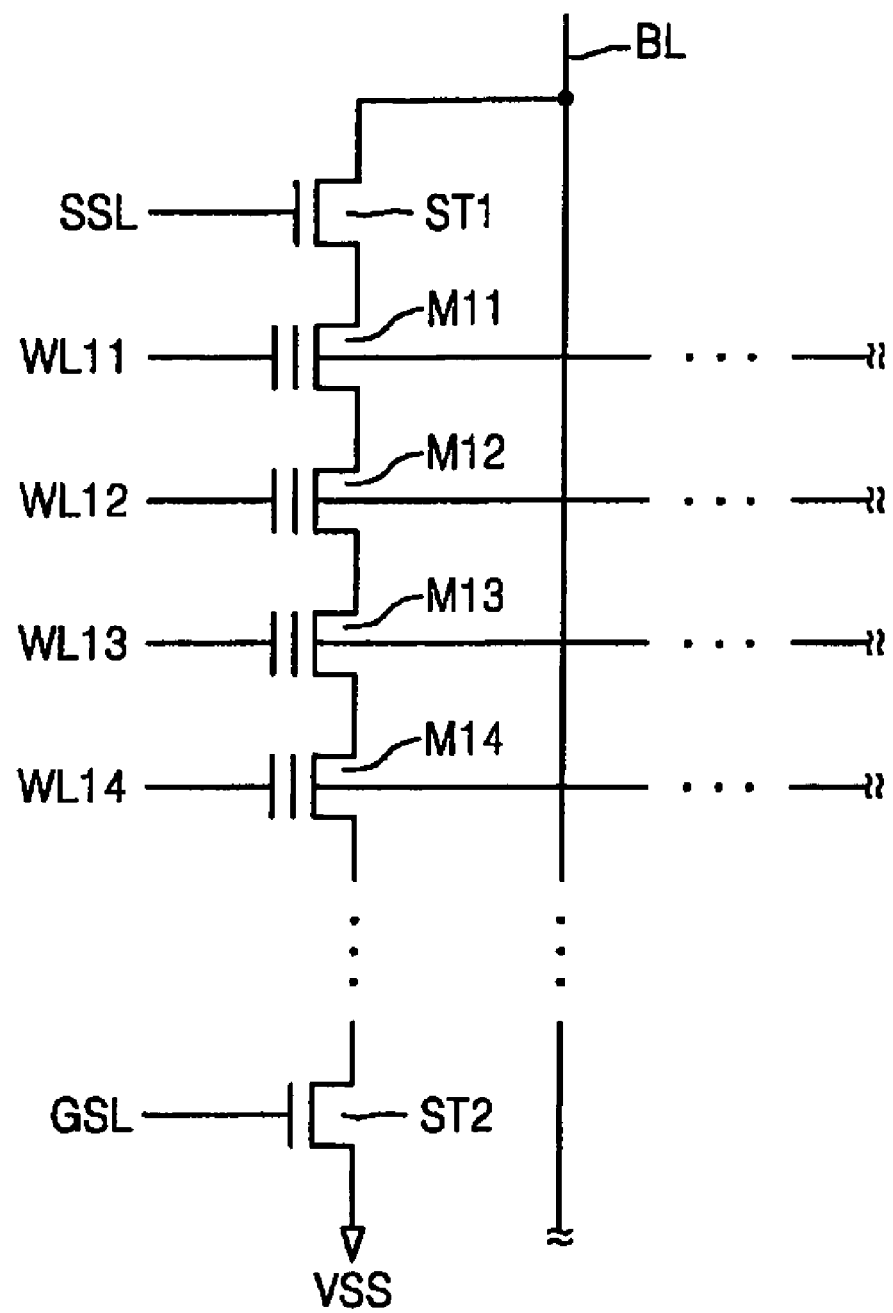
FIG. 1A is a circuit diagram of a memory cell included in a conventional NAND type flash memory.
Figure 1B:
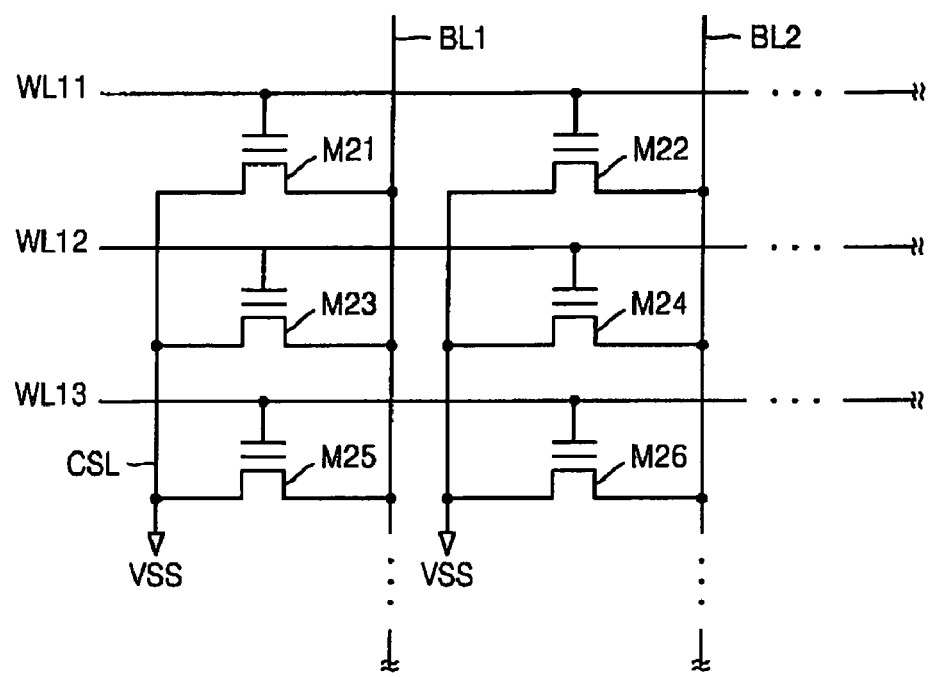
FIG. 1B is a circuit diagram of a memory cell included in a conventional NOR type flash memory.

The present invention will now be described more fully hereinafter with reference to the accompanying drawings, in which preferred embodiments of the invention are shown. This invention, however, may be embodied in many different forms and should not be construed as limited to the embodiments set forth herein. Rather, these embodiments are provided so that this disclosure will be thorough and complete, and will fully convey the scope of the invention to those skilled in the art. In the drawings, like numbers refer to like elements throughout.

Figure 3:
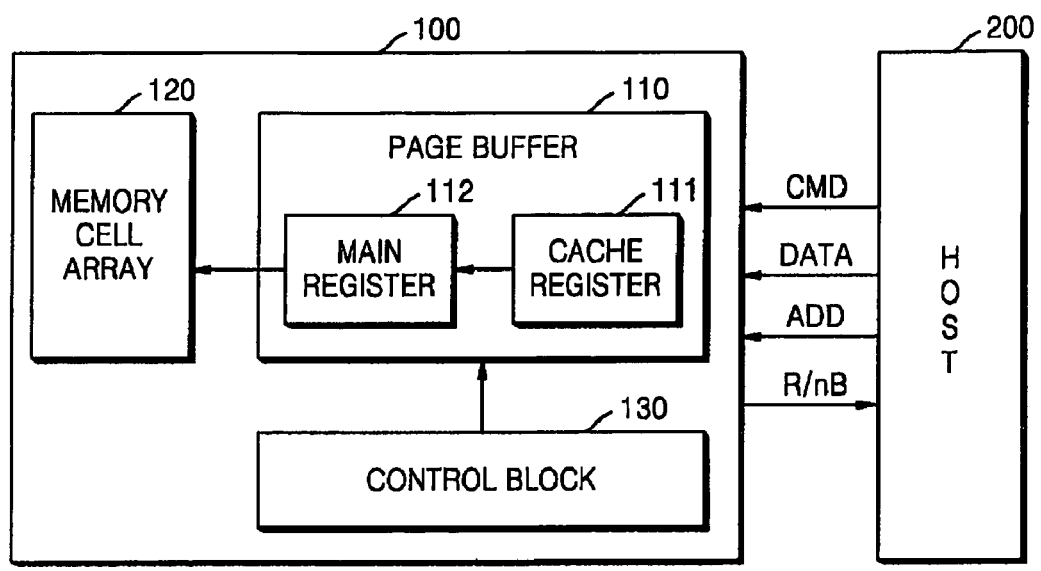
FIG. 3 is a block diagram of a non-volatile memory device according to an embodiment of the present invention.

FIG. 3 is a block diagram of a non-volatile memory device 100 including page buffer 110, memory cell array 120, and control block 130. Page buffer 110 temporarily stores data provided from host 200 which is external to non-volatile memory device 100. Memory cell array 120 includes at least one memory cell and stores data provided from page buffer 110. Control block 130 controls an operation of page buffer 110 such as data storage, data output, etc.

In order to program memory cell array 120 included in non-volatile memory device 100 by a cache program operation, page buffer 110 may include cache register 111 and main register 112. The non-volatile memory device 100 is electrically connected to an external host 200 and receives a command CMD, data DATA, and an address ADD related to the programming operation from host 200. In addition, a ready/busy (R/nB) signal indicating a ready state or a busy state of the non-volatile memory device 100 can be provided to host 200.

Figure 4:
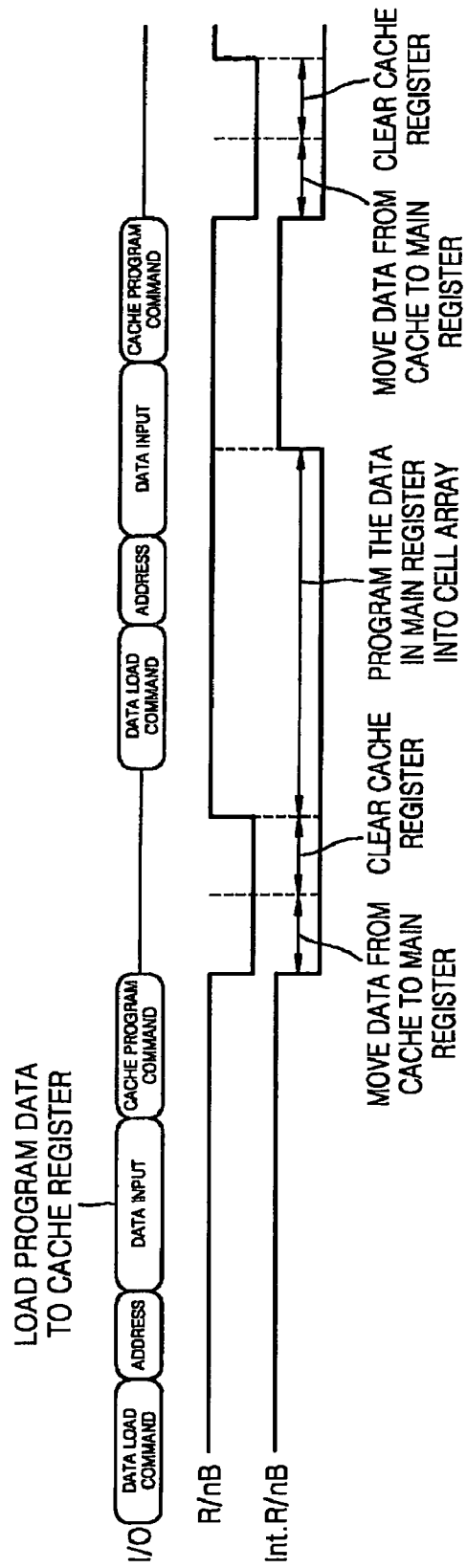
FIG. 4 is a timing diagram illustrating a cache program operation in the non-volatile memory device of FIG. 3, according to an embodiment of the present invention.

FIG. 4 is a timing diagram illustrating a cache program operation in the non-volatile memory device 100 of FIG. 3. A data load command, an address, data, and a cache program command are input to non-volatile memory device 100 through a predetermined input/output port (I/O). In order to program a predetermined page, the data load command, the address, the data, and the cache program command are input. The input data is loaded into cache register 111 and the R/nB signal and an internal ready/busy (Int.R/nB) signal are changed to a logic low in response to the cache program command. While the R/nB signal is at a logic low, the data stored in cache register 111 is moved to main register 112. Before the R/nB signal is changed to a logic high and after the data stored in cache register 111 is moved to main register 112, cache register 111 is cleared.

When the clearing operation for cache register 111 is completed, the R/nB signal is changed to logic high. A command signal, an address, data and cache program command signals for programming the next page are received from an external source. The data stored in main register 112 is programmed to memory cell array 120. While this data is programmed to memory cell array 120, int.R/nB signal, which indicates an internal operation of non-volatile memory device 100, is maintained at a logic low. When the data load command is inputted for a page programming operation, a determination is made based on the data load command whether or not to clear cache register 111 included in page buffer 110. Cache register 111 does not need to be cleared again since the cache register 111 was cleared in programming the previous page. In other words, cache register 111 may be cleared to correspond to the data load command input. Preferably, when the corresponding page program is the initial page program in a predetermined programming operation, control block 130 clears cache register 111 in response to the input of the data load command. In addition, after the corresponding page program is performed, a clearing operation of cache register 111 is skipped when the data load command for the next page program is input.

As illustrated in FIG. 4, after data is moved from cache register 111 to main register 112, cache register 111 is cleared, the R/nB signal is changed to logic high and the data load command is input for the next page program operation received externally. A clearing operation for cache register 111 is performed in response to the inputted data load command. Cache register 111 was cleared previously. Thus, even if a clearing operation is performed, the data in cache register 111 does not change and the power voltage noise is not generated. Accordingly, even if a clearing operation corresponding to the input of the data load command occurs where a cache program is operated, a decrease in programming reliability due to power voltage noise is avoided. When the data load command corresponding to the initial page program is input, cache register 111 is cleared. When the next data load command is input as illustrated in FIG. 4, a clearing operation of cache register 111 may be skipped. Since cache register 111 has previously been cleared, the following data can be stored in cache register 111.

After the data load command, the address, data, and cache program command signals associated with the next page program are inputted. The data for the next page program stored in cache register 111 is moved to main register 112. In addition, when the data stored in cache register 111 is completely moved to main register 112, cache register 111 is cleared and the programming operation for the memory cell array 120 is performed.

Figure 5:
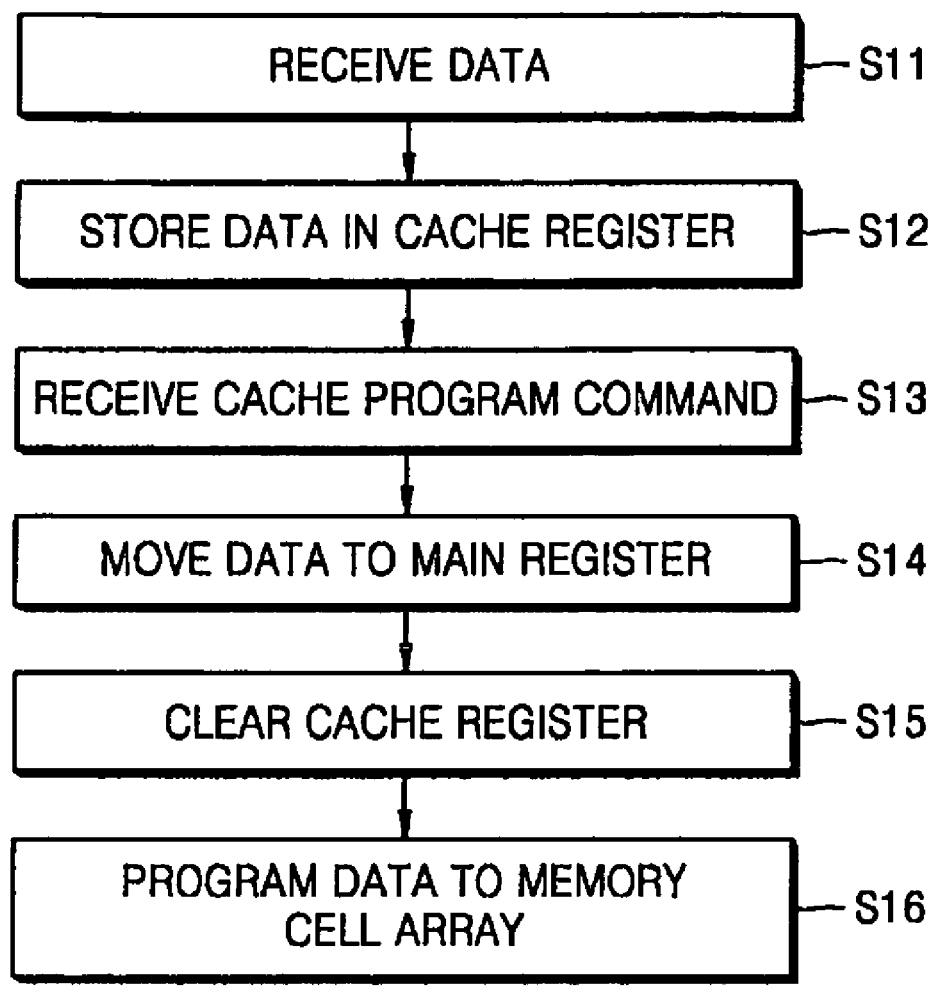
FIG. 5 is a flowchart of a method of cache programming in a non-volatile memory device according to an embodiment of the present invention.

FIG. 5 is a flowchart illustrating a command, an address and data for a predetermined page programming operation initially performed in step S11. The data load command and data are stored in the cache register in step S12. A cache program command is received in step S13 and the data stored in the cache register is moved to the main register in response to the received cache program command in step S14. After the data stored in the cache register is completely moved to the main register, the cache register is cleared in step S15 and the data stored in the main register is programmed to a memory cell array in step S16. In other words, before the data is substantially programmed to the memory cell array, the cache register is cleared. This avoids power voltage noise from being generated during the programming operation which would otherwise decrease reliability during data programming. Even if the data load command for the next page program is input while the data is programmed to memory cell array and the cache register is cleared in response to the data load command, the cache register has already been cleared and thus data of the cache register does not change. This avoids power voltage noise from being generated.

Steps 14 and 15 are sequentially performed. A ready/busy (R/nB) signal indicating a ready state or a busy state is maintained at a first level (for example, logic low) indicating a busy state during steps 14 and 15. In addition, after the cache register is cleared in step 15, the R/nB signal is changed to a second level (for example, logic high) indicating a ready state. A command, an address and data signals for the next page program are input to the memory device after the cache register is cleared. In response to the data load command provided from an external host, the cache register may or may not be cleared. In particular, during a predetermined programming operation, the cache register may be cleared only when the data load command corresponding to the initially performed page program is inputted.

Figure 6:
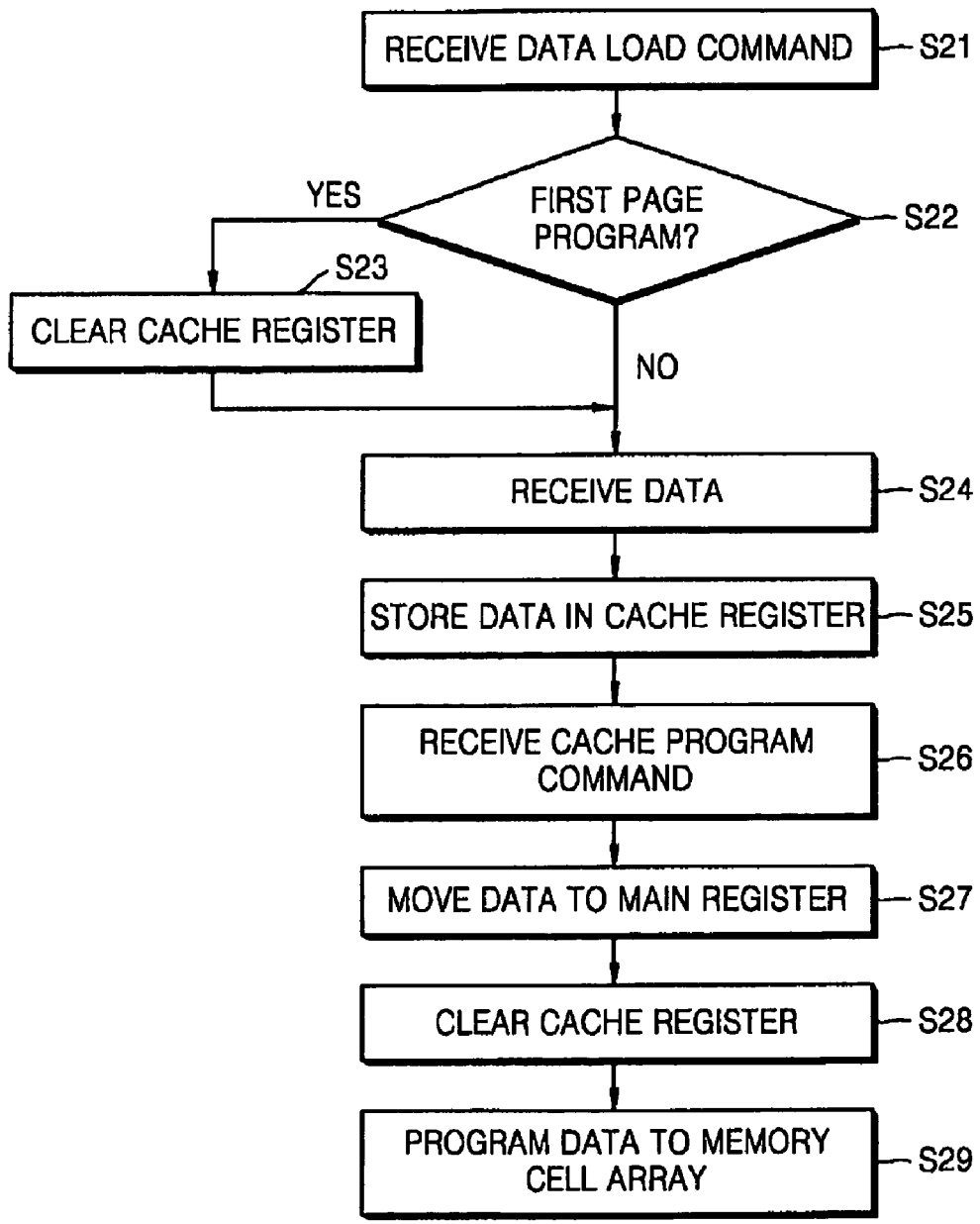
FIG. 6 is a flowchart of a method of cache programming in a non-volatile memory device according to another embodiment of the present invention.

FIG. 6 is a flowchart illustrating a method of cache programming in a non-volatile memory device where a data load command for a page program is initially received from an external host in step S21. When the data load command is received, a determination is made at step S22 as to whether or not the current page program is the initial page program. If the page program is the initial page program, the cache register is cleared in step S23. If the page program is not the initial page program and a page programming operation was previously performed by a cache program command instead, the cache register clearing operation is skipped. Data is received in step S24 for page programming. This received data is stored in the cache register in step S25. The cache program command is received in step S26 and the data stored in the cache register is moved to a main register in step S27. Once this data is completely moved to the main register, the cache register is cleared in step S28 and the data stored in the main register is programmed to a memory cell array in step S29. In this manner, the cache register is cleared in response to the data load command with respect to the initial page program and thus, the data stored in the cache register can be prevented from being incorrectly programmed. Moreover, when page programming is performed and the data stored in the cache register is moved to the main register and then the cache register is cleared, a clearing operation of the cache register in response to the data load command for the next page program can be skipped. This prevents the cache register from being cleared repeatedly. As described above, power voltage noise generated when a cache register is cleared during data programming to a memory cell array of a non-volatile memory device can be prevented, thereby improving data programming reliability.

While the present invention has been particularly shown and described with reference to exemplary embodiments thereof, it will be understood by one of ordinary skill in the art that various changes in form and details may be made therein without departing from the spirit and scope of the present invention as defined by the following claims.

What is claimed is:

1. A programming method of a non-volatile memory device having a memory cell array comprises:
    storing data input from an external source to a cache register in response to a first command;
    receiving a second command after receiving the first command;
    moving the data stored in the cache register to a main register;
    clearing the cache register after moving the data stored in the cache register to the main register; and
    programming the data stored in the main register to the memory cell array after clearing the cache register,
    wherein moving the data, clearing the cache register and programming the data are sequentially performed in response to the second command.

2. The programming method of claim 1, wherein the first command is a data load command and the second command is a cache program command.

3. The programming method of claim 2 wherein clearing the cache register is performed immediately after moving the data stored in the cache register to the main register.

4. The programming method of claim 2 further comprising:
    changing a control signal to a first level to indicate a busy state of the non-volatile memory device in response to the cache program command,
    wherein the sequential; performing of the moving of the data stored in the cache register to the main register and the clearing of the cache register occurs during a portion of a period when the control signal is the first level.

5. The programming method of claim 4 wherein the control signal is changed to a second level to indicate a ready state of the non-volatile memory device after the cache register is cleared.

6. The programming method of claim 1 further comprising:
    receiving a subsequent first command after receiving the second command; and
    storing subsequent data input from the external source to the cache register without clearing the cache register in response to the subsequent first command.

7. A programming method of a non-volatile memory device having a memory cell array, the programming method comprising:
    receiving a data load command and page data associated with a current page programming operation;
    determining whether the current page programming operation is an initial page programming operation, and if the current page programming operation is an initial page programming operation clearing a cache register;
    storing the page data in the cache register;
    receiving a cache program command for the current page programming operation after receiving the data load command;
    moving the page data stored in the cache register to a main register;
    clearing the cache register after moving the page data to the main register after moving the data stored in the cache register; and
    after clearing the cache register, programming the page data stored in the main register to the memory cell array, such that moving the page data, clearing the cache register and programming the page data are sequentially performed in response to the cache program command.

8. The programming method of claim 7 wherein clearing the cache register is performed immediately after moving the page data to the main register.

9. The programming method of claim 7 further comprising:
    changing a control signal indicating a ready state or a busy state of the non-volatile memory device to a first level indicating a busy state in response to the cache program command; and
    sequentially performing the moving of the data stored in the cache register to the main register and clearing of the cache register during a period when the control signal is in the first level.

10. The programming method of claim 9, wherein the control signal is changed to a second level indicating a ready state after the cache register is cleared.

11. The programming method of claim 7 further comprising clearing the cache register in response to the data load command.

12. A non-volatile memory device comprising:
    a page buffer including a cache register and a main register configured to store externally provided data;
    a memory cell array configured to receive the data from the page buffer during a programming operation, and having at least one memory cell configured to store the data; and
    a control block configured to control operation of the page buffer during the programming operation, such that the data is stored in the cache register after receiving the data load command, the data is next moved from the cache register to the main register, after the data is moved from the cache register to the main register the cache register is cleared, and only after the cache register is cleared, programming the data to the memory cell array from the main register, wherein the operations of moving the page data, clearing the cache register and programming the data are sequentially performed after receiving a cache program command.

13. The device of claim 12 wherein the control block is further configured to generate a control signal indicating a ready state or a busy state of the non-volatile memory device, wherein the control signal indicates the busy state in response to the cache program command.

14. The device of claim 13 wherein the control block is further configured to move the data stored in the cache register to the main register and immediately thereafter clear the cache register during a period when the control signal indicates the busy state.

15. The device of claim 12 wherein the control block is further configured to determine whether the data load command is associated with an initial page programming operation, and upon determining that the data load command is associated with an initial page programming operation, immediately clearing the cache register.

* * * * *